(12) United States Patent
Kang

(10) Patent No.: US 9,721,626 B2
(45) Date of Patent: Aug. 1, 2017

(54) BUILT-IN TEST CIRCUIT OF SEMICONDUCTOR APPARATUS

(71) Applicant: SK hynix Inc., Gyeonggi-do (KR)

(72) Inventor: Tae Jin Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 325 days.

(21) Appl. No.: 14/537,608

(22) Filed: Nov. 10, 2014

(65) Prior Publication Data

US 2016/0131697 A1    May 12, 2016

(51) Int. Cl.
*G01R 31/02* (2006.01)
*G11C 7/10* (2006.01)
*G11C 7/22* (2006.01)
*G11C 29/06* (2006.01)
*G11C 29/12* (2006.01)

(52) U.S. Cl.
CPC ............ *G11C 7/1084* (2013.01); *G11C 7/225* (2013.01); *G11C 29/06* (2013.01); *G11C 29/12005* (2013.01)

(58) Field of Classification Search
CPC   G01R 31/26; G01R 31/2642; G01R 31/2648; G01R 31/2831; G01R 31/317
See application file for complete search history.

(56) References Cited

U.S. PATENT DOCUMENTS

| 8,410,814 B2 | 4/2013 | Scott et al. |
| 2003/0085731 A1* | 5/2003 | Iwase ............... G01R 31/31701 326/16 |
| 2009/0015309 A1* | 1/2009 | Ko ................. H03K 19/017581 327/291 |

* cited by examiner

*Primary Examiner* — Tung X Nguyen
(74) *Attorney, Agent, or Firm* — IP & T Group LLP

(57) ABSTRACT

A semiconductor apparatus includes a clock buffer and a reference voltage generation unit. The clock buffer generates an internal clock signal, based on first and second clock signals, in a first operation mode, and generates the internal clock signal, based on the first clock signal and a reference voltage, when a normal operation test is performed in a second operation mode. The reference voltage generation unit generates the reference voltage when the normal operation test is performed in the second operation mode.

18 Claims, 5 Drawing Sheets

BUILT-IN TEST CIRCUIT OF SEMICONDUCTOR APPARATUS

FIELD OF THE INVENTION

Various embodiments relate to a semiconductor apparatus and, more particularly, to a test circuit and a test method of a semiconductor apparatus.

BACKGROUND

Semiconductor apparatuses generally include chips or dies that are formed on a wafer and then packaged. Semiconductor apparatuses are considered to be at a wafer level when their chips or dies are still in wafer form and are at the package level after the chips or dies are packaged.

Various tests may be performed on semiconductors to ensure function, yield, quality, and reliability. A wafer level test may be performed when a semiconductor apparatus is in the wafer stage. The wafer level test may be performed using external test equipment and a probe. After the semiconductor apparatus is packaged, a package level test may be performed using external test equipment.

Although it is the norm that semiconductor apparatuses are tested using external test equipment, semiconductor apparatuses may include built-in self test circuits to increase test efficiency. The built-in self test circuits allow various tests to be performed faster and with more testing options compared to tests conducted by external test equipment.

At the package level, various tests associated with all operations of the semiconductor apparatus may be performed. However, at the wafer level, the semiconductor apparatus is limited by its number of usable pads or pins, which limit the number of signals that may be input from external test equipment.

SUMMARY

Various embodiments are directed to a built-in self test circuit which may perform not only a burn-in stress test but also a normal operation test by using a limited number of control signals inputted from an external device during a wafer level test, and a semiconductor apparatus including the same.

Also, various embodiments are directed to a semiconductor apparatus which includes a clock buffer capable of generating an internal clock from a single-ended clock during a wafer level test.

In an embodiment, a semiconductor apparatus may include a clock buffer suitable for generating an internal clock signal, based on first and second clock signals, in a first operation mode, and generating the internal clock signal, based on the first clock signal and a reference voltage, when a normal operation test is performed in a second operation mode, and a reference voltage generation unit suitable for generating the reference voltage when the normal operation test is performed in the second operation mode.

In an embodiment, a semiconductor apparatus may include a test control block suitable for generating burn-in test control signals for a burn-in stress test and a normal test control signal for a normal operation test, based on first address signals received through a first address buffer group, when a wafer test signal is enabled, and a clock buffer suitable for generating an internal clock signal, based on first and second clock signals, and generate the internal clock signal, based on the first clock signal and a reference voltage, during the normal operation test.

DETAILED DESCRIPTION

Figure 1:
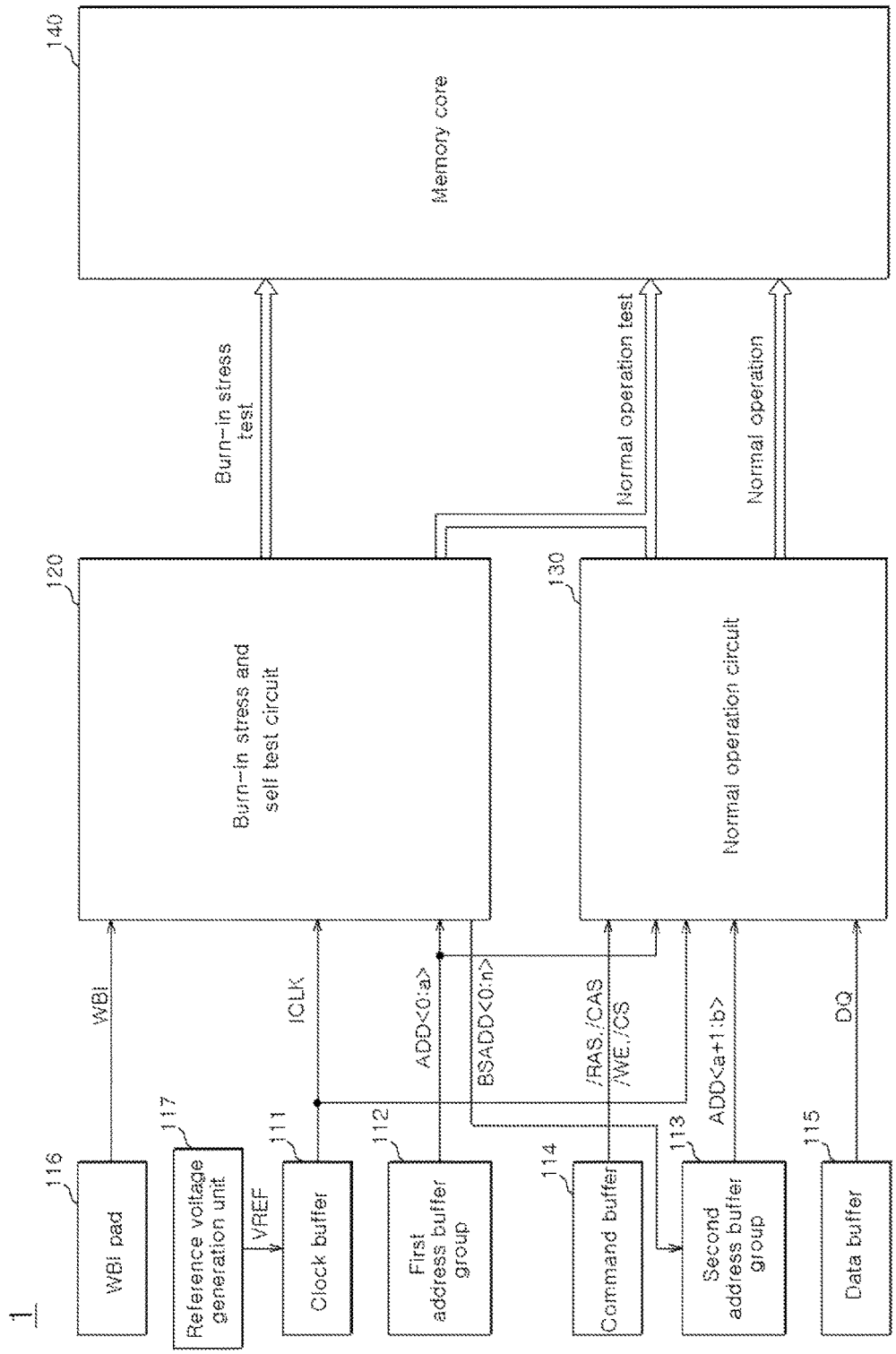
FIG. 1 is a diagram illustrating the configuration of a semiconductor apparatus in accordance with an embodiment.

A built-in test circuit of a semiconductor apparatus will be described below with reference to the accompanying drawings through various examples of embodiments. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used is for the purpose of describing particular embodiments only and is not intended to limit the scope of the present invention.

In FIG. 1, a semiconductor apparatus 1 in accordance with an embodiment may include a plurality of pads and/or buffers, a reference voltage generation unit 117, a burn-in stress and self test circuit 120, a normal operation circuit 130, and a memory core 140. The plurality of pads and/or buffers may include a clock buffer 111, a first address buffer group 112, a second address buffer group 113, a command buffer 114, a data buffer 115, and a wafer burn-in (WBI) pad 116. The buffer and buffer group may include pads for receiving the control signals inputted from an external device (for example, a master device, a host device, a controller or test equipment) which is electrically coupled with the semiconductor apparatus 1.

The clock buffer 111 may generate an internal clock signal ICLK and provide the internal clock signal ICLK to internal circuits of the semiconductor apparatus 1. The first address buffer group 112 may receive an allocated number of address signals ADD<0:a> and provide them to the internal circuits of the semiconductor apparatus 1. The second address buffer group 113 may also receive an allocated number of address signals ADD<a+1:b> and provide them to the internal circuits of the semiconductor apparatus 1. The allocated numbers may correspond to the numbers of address buffers which each of the address buffer groups 112 and 113 includes. The command buffer 114 and the data buffer 115 may respectively receive command address signals /RAS, /CAS, /WE and /CS and data DQ and provide them to the internal circuits of the semiconductor apparatus 1.

The WBI pad 116 may receive a wafer test signal WBI to instruct the semiconductor apparatus 1 to perform a wafer level test. Therefore, the semiconductor apparatus 1 may enter a test operation mode when the wafer test signal WBI is enabled, and may exit the test operation mode and enter a normal operation mode when the wafer test signal WBI is disabled. In the test operation mode, the semiconductor apparatus 1 may perform the wafer level test, and in the normal operation mode, the semiconductor apparatus 1 may be at all states other than those in the test operation mode, such as the sleep state, the standby state and the active state of the semiconductor apparatus 1. In the following detailed descriptions, it will be explained that a first operation mode means the normal operation mode and a second operation mode means the test operation mode.

The reference voltage generation unit 117 may generate a reference voltage VREF in the second operation mode of the semiconductor apparatus 1. As will be described later, the reference voltage generation unit 117 may generate the reference voltage VREF in a normal operation test of the semiconductor apparatus 1. The reference voltage VREF generated by the reference voltage generation unit 117 may be provided to the clock buffer 111.

The burn-in stress and self test circuit 120 may be provided for an operation of testing the semiconductor apparatus 1. The burn-in stress and self test circuit 120 may be a built-in self test circuit for the wafer level test of the semiconductor apparatus 1. The burn-in stress and self test circuit 120 may receive signals from the plurality of pads and/or buffers 111 to 116 and generate control signals for the wafer level test of the semiconductor apparatus 1. The burn-in stress and self test circuit 120 allows a burn-in stress test for evaluating the performance of the semiconductor apparatus 1, by applying a specific stress to the semiconductor apparatus 1. Also, the burn-in stress and self test circuit 120 may cooperate with the normal operation circuit 130 to allow a normal operation test to be performed. The burn-in stress test may apply stress to the semiconductor apparatus 1 by increasing the temperature of the semiconductor apparatus 1 or changing the power supply voltage (i.e. voltage level) provided to the semiconductor apparatus 1. The normal operation test may be performed through all normal operations of accessing the memory core 140 and storing and outputting data.

The burn-in stress and self test circuit 120 may generate burn-in test control signals for the burn-in stress test and a normal test control signal for the normal operation test, by receiving the wafer test signal WBI, the internal clock signal ICLK and the address signals ADD<0:a> from the WBI pad 116, the clock buffer 111 and the first address buffer group 112, respectively. The burn-in stress and self test circuit 120 may apply stress to the memory core 140 and the semiconductor apparatus 1 based on the burn-in test control signals, such that the burn-in stress test may be performed. Also, the burn-in stress and self test circuit 120 cooperates with the normal operation circuit 130 such that the semiconductor apparatus 1 may perform the normal operation test based on the normal test control signal.

The burn-in stress and self test circuit 120 may generate a plurality of self test address signals BSADD<0:n>, based on the address signals ADD<0:a> which are received through the first address buffer group 112 in the second operation mode of the semiconductor apparatus 1. The burn-in stress and self test circuit 120 may provide the plurality of self test address signals BSADD<0:n> to the second address buffer group 113. The second address buffer group 113 may provide the address signals ADD<a+1:b> received from the external device to the normal operation circuit 130 in the first operation mode of the semiconductor apparatus 1 similar to the first address buffer group 112. In the second operation mode of the semiconductor apparatus 1, the second address buffer group 113 may provide the self test address signals BSADD<0:n> outputted from the burn-in stress and self test circuit 120 to the normal operation circuit 130 as the address signals ADD<a+1:b>. In this way, in the second operation mode of the semiconductor apparatus 1, the second address buffer group 113 receives address signals from the burn-in stress and self test circuit 120, instead of receiving address signals from the external device. That is to say, in the second operation mode of the semiconductor apparatus 1, the second address buffer group 113 may operate as if it receives address signals from the external device, although, in actuality, it does not receive address signals from the external device.

The semiconductor apparatus 1 may perform a normal operation in response to b+1 number of address signals ADD<0:b>. In the first operation mode, the first address buffer group 112 may receive a+1 number of the address signals ADD<0:a> from the external device, and the second address buffer group 113 may receive b-a number of the address signals ADD<a+1:b> from the external device. When the semiconductor apparatus 1 exists at a wafer level before it is packaged, the number of pins an external device may use to access the semiconductor apparatus 1 may be limited. Thus, a test for the semiconductor apparatus 1 may be performed by only a limited number of signals which are received from the external device. The semiconductor apparatus 1 in accordance with the embodiment may internally generate a plurality of signals for the normal operation test of the semiconductor apparatus 1, from the limited number of signals which are inputted from the external device.

In the second operation mode, the first address buffer group 112 receives the a+1 number of the address signals ADD<0:a> from the external device, but the second address buffer group 113 does not receive address signals from the external device. Instead, the burn-in stress and self test circuit 120 may generate b-a number of address signals (that is, the self test address signals BSADD<0:n>), based on the a+1 number of the address signals ADD 0:a>, and the generated address signals may be inputted to the second address buffer group 113. That is, the b-a number of the self test address signals BSADD<0:n> may be inputted to the normal operation circuit 130 as if they are address signals inputted through the second address buffer group 113 from the external device. Therefore, since the semiconductor apparatus 1 includes the second address buffer group 113 and the burn-in stress and self test circuit 120, the normal operation test may be performed in the second operation mode without a substantial design change of the normal operation circuit 130 of the semiconductor apparatus 1.

Although the burn-in stress and self test circuit 120 and the normal operation circuit 130 are illustrated as separate blocks in FIG. 1, these blocks may be divided in terms of only their functions. Some internal circuits may perform only the function of the burn-in stress and self test circuit 120, and the remaining internal circuits may perform the function of the burn-in stress and self test circuit 120 and at the same time perform the function of the normal operation circuit 130. As will be described later, it may be understood that, in the semiconductor apparatus 1 in accordance with the embodiment, a function for performing a normal operation test is added to the function of a conventional normal operation circuit which performs only the normal operation of a semiconductor apparatus, to minimize the changes to the conventional normal operation circuit and the addition of circuits for the normal operation test.

The memory core 140 may be a region where memory cells in which data are stored are disposed, and may include all the internal circuits of the semiconductor apparatus 1 which are not shown in FIG. 1. While not shown, the memory core 140 may include a plurality of memory cells, and the plurality of memory cells may be electrically coupled with a plurality of row lines and a plurality of column lines at points where the row lines and the column lines cross each other.

Figure 2:
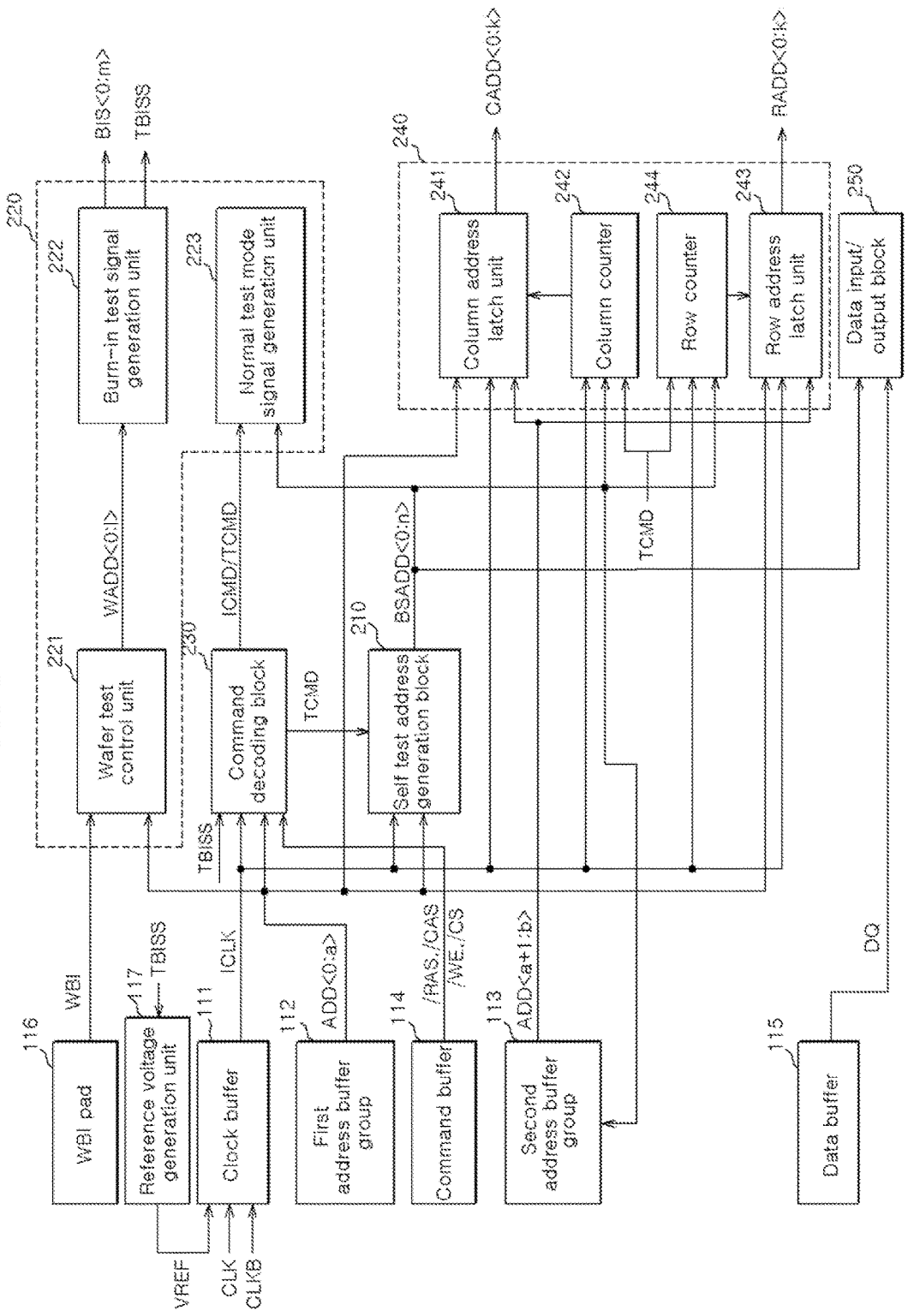
FIG. 2 is a diagram illustrating the detailed configuration of the semiconductor apparatus shown in FIG. 1.

FIG. 2 is a diagram illustrating the detailed configuration of the semiconductor apparatus 1 shown in FIG. 1. In FIG. 2, similar to FIG. 1, the semiconductor apparatus 1 may include the clock buffer 111, the first address buffer group 112, the second address buffer group 113, the command buffer 114, the data buffer 115, the WBI pad 116, and the reference voltage generation unit 117.

The clock buffer 111 may receive first and second clock signals CLK and CLKB from the external device in the first operation mode of the semiconductor apparatus 1, and may generate the internal clock signal ICLK, based on the first and second clock signals CLK and CLKB. The second clock signal CLKB may be the differential clock signal of the first clock signal CLK. The clock buffer 111 may receive the first clock signal CLK and may not receive the second clock signal CLKB, from the external device, in the normal operation test of the semiconductor apparatus 1. At this time, the clock buffer 111 may generate the internal clock signal ICLK, based on the first clock signal CLK and the reference voltage VREF generated in the reference voltage generation unit 117.

The first address buffer group 112 may receive the address signals ADD<0:a> from the external device in the first and second operation modes. The second address buffer group 113 may receive the address signals ADD<a+1:b> from the external device in the first operation mode, but may not receive address signals from the external device in the second operation mode. Instead, the second address buffer group 113 may receive address signals which are generated in the internal circuit of the semiconductor apparatus 1 in the second operation mode.

The command buffer 114 may receive the command address signals /RAS, /CAS, /WE and /CS from the external device in the first operation mode, and the data buffer 115 may receive the data DQ.

In FIG. 2, the semiconductor apparatus 1 may further include a self test address generation block 210. The self test address generation block 210 may be a component element which is included in the burn-in stress and self test circuit 120 of FIG. 1. The self test address generation block 210 may generate the plurality of self test address signals BSADD<0:n>, based on the address signals ADD<0:a> received through the first address buffer group 112, in the second operation mode. The self test address generation block 210 may provide the plurality of self test address signals BSADD<0:n> to the second address buffer group 113. The self test address generation block 210 may include a decoding circuit which decodes the address signals ADD<0:a> received through the first address buffer group 112 and generates the plurality of self test address signals BSADD<0:n>.

As shown in FIG. 2, the semiconductor apparatus 1 may further include a test control block 220, a command decoding block 230, a core access block 240, and a data input/output block 250. The test control block 220 may be electrically coupled with the WBI pad 116, and may receive the wafer test signal WBI from the WBI pad 116. When the wafer test signal WBI is enabled, the test control block 220 may generate burn-in test control signals BIS<0:m> for the burn-in stress test or may generate a normal test control signal TBISS for the normal operation test, based on the address signals ADD<0:a> received through the first address buffer group 112. The test control block 220 may generate the normal test control signal TBISS when the address signals ADD<0:a> received through the first address buffer group 112 have a specified logic combination, and may generate the burn-in test control signals BIS<0:m> when the address signals ADD<0:a> have other logic combinations.

The test control block 220 may include a wafer test control unit 221, a burn-in test signal generation unit 222, and a normal test mode signal generation unit 223. The wafer test control unit 221 may output the address signals ADD<0:a> received through the first address buffer group 112, as burn-in address signals WADD<0:l>, when the wafer test signal WBI is enabled. For example, the wafer test control unit 221 may generate the burn—in address signals WADD<0:l>, by receiving the address signals ADD<0:a> a multitude of times in synchronization with the rising edge and the falling edge of the internal clock signal ICLK. For example, the burn-in address signals WADD<0:l> may be combined signals of the address signals ADD<0:a> inputted in synchronization with the rising edge of the internal clock signal ICLK and the address signals ADD<0:a> inputted in synchronization with the falling edge of the internal clock signal ICLK.

The burn-in test signal generation unit 222 may generate the burn-in test control signals BIS<0:m> and the normal test control signal TBISS in response to the burn-in address signals WADD<0:l>. The burn-in test signal generation unit 222 may generate the normal test control signal TBISS for the normal operation test of the semiconductor apparatus 1, in response to the burn-in address signals WADD<0:l>, when the address signals ADD<0:a> are inputted with the specified logic combination. Further, the burn-in test signal generation unit 222 may generate the burn-in test control signals BIS<0:m> for the burn-in stress test of the semiconductor apparatus 1, in response to the burn-in address signals WADD<0:l>, when the address signals ADD<0:a> have other logic combinations than the specified logic combination. The burn-in test control signals BIS<0:m> may be utilized as signals which apply a stress to the semiconductor apparatus 1 by increasing the temperature of the semiconductor apparatus 1 or changing the power supply voltage provided to the semiconductor apparatus 1.

The reference voltage generation unit 117 may receive the normal test control signal TBISS. The reference voltage generation unit 117 may generate the reference voltage VREF in response to the normal test control signal TBISS, and may provide the reference voltage VREF to the clock buffer 111 during the normal operation test of the semiconductor apparatus 1.

The command decoding block 230 may receive the normal test control signal TBISS, the internal clock signal ICLK, the address signals ADD<0:a>, and the command address signals /RAS, /CAS, /WE and /CS. The command decoding block 230 may generate an internal command signal ICMD of the semiconductor apparatus 1 in response to the command address signals /RAS, /CAS, /WE and /CS and the internal clock signal ICLK. The command address signals may be signals inputted from the external device, such as a row address strobe signal /RAS, a column address strobe signal /CAS, a write enable signal /WE and a chip select signal /CS, but the command address signals are not limited thereto. The internal command signal ICMD may include, for example, an active command, a precharge command, a read command, a write command, a refresh command, or the like. The command decoding block 230 may generate a test command signal TCMD, based on the address signals ADD<0:a> received through the first address buffer group 112, the second operation mode. The command decoding block 230 may determine whether it is the first operation mode or the second operation mode, in response to: the normal test control signal TBISS. The command decoding block 230 may generate the test command signal TCMD, from the address signals ADD<0:a> received through the first address buffer group 112, when the normal test control signal TBISS is enabled. The test command signal TCMD may be inputted to the self test address generation block 210. The self test address generation block 210 may generate the self test address signals BSADD<0:n> by combining the address signals ADD<0:a> in a variety of ways in response to the test command signal TCMD. For example, the test command signal TCMD may include a plurality of command signals to allow different operations to be performed, and the self test address generation block 210 may generate the self test address signals BSADD<0:n> which have different logic combinations corresponding to the plurality of command signals.

The core access block 240 may generate internal address signals CADD<0:k> and RADD<0:k>, based on the address signals ADD<0:b> which are outputted from the first address buffer group 112 and the second address buffer group 113. In the first operation mode, since both the first and second address buffer groups 112 and 113 receive the address signals allocated thereto from the external device, the core access block 240 may generate the internal address signals CADD<0:k> and RADD<0:k>, based on the address signals ADD<0:b> provided from the external device. In the second operation mode, the first address buffer group 112 may receive the address signals ADD<0:a> from the external device, and the second address buffer group 113 may receive the self test address signals BSADD<0:n> which are generated by the self test address generation block 210. Accordingly, in the second operation mode, the core access block 240 may generate the internal address signals CADD<0:k> and RADD<0:k>, based on the externally received address signals ADD<0:a> and the self test address signals BSADD<0:n>. The internal address signals may include column address signals CADD<0:k> and row address signals RADD<0:k>.

The core access block 240 may include address latch units and counters. The address latch units may include a column address latch unit 241 and a row address latch unit 243, and the counters may include a column counter 242 and a row counter 244. The column address latch unit 241 and the column counter 242 may generate the column address signals CADD<0:k>, for example, in the write and read operations of the semiconductor apparatus 1, and the row address latch unit 243 and the row counter 244 may generate the row address signals RADD<0:k>, for example, in the active and refresh operations of the semiconductor apparatus 1. The address latch units 241 and 243 may be electrically coupled with the first address buffer group 112, the second address buffer group 113, and the clock buffer 111. The column address latch unit 241 may latch the address signals ADD<0:b>, which are received through the first and second address buffer groups 112 and 113, in synchronization with the internal clock signal ICLK, and may generate the column address signals CADD<0:k>. Based on the column address signals CADD<0:k>, a specified region, for example, a specified column line, of the memory core 140 shown in FIG. 1, may be accessed. The column counter 242 may be activated in response to the test command signal TCMD in the second operation mode of the semiconductor apparatus 1. The column counter 242 may increase or decrease the logic value of the address signals, which are latched by the column address latch unit 241, in response to the test command signal TCMD. In other words, the column counter 242 increases or decreases the logic value of the address signals which are latched by the column address latch unit 241 in the second operation mode, in such a manner that, even though the semiconductor apparatus 1 receives a limited number of address signals, the column address signals CADD<0:k> of various combinations may be internally generated. Therefore, without additional input of address signals, the various regions of the memory cores 140 may be accessed by the column counter 242.

The row address latch unit 243 may latch the address signals ADD<0:b>, which are received through the first and second address buffer groups 112 and 113, in synchronization with the internal clock signal ICLK, and may generate the row address signals RADD<0:k>. Based on the row address signals RADD<0:k>, a specified region, for example, a specified row line, of the memory core 140 may be accessed. The row counter 244 may be activated in response to the test command signal TCMD in the second operation mode of the semiconductor apparatus 1. The row counter 244 may increase or decrease the logic value of the address signals, which are latched by the row address latch unit 243, in response to the test command signal TCMD. In other words, the row counter 244 increases or decreases the logic value of the address signals which are latched by the row address latch unit 243 in the second operation mode, in such a manner that, even though the semiconductor apparatus 1 receives a limited number of address signals, the row address signals RADD<0:k> of various combinations may be internally generated. Therefore, without additional input of address signals, the various regions of the memory cores 140 may be accessed by the row counter 244.

The internal command signal ICMD or the test command signal TCMD which is generated by the command decoding block 230 may be inputted to the normal test mode signal generation unit 223. The normal test mode signal generation unit 223 may generate various test mode signals which may be used in the normal operations of the semiconductor apparatus 1. In the second operation mode of the semiconductor apparatus 1, the normal test mode signal generation unit 223 may generate various test mode signals in response to the test command signal TCMD and the self test address signals BSADD<0:n>.

The data input/output block 250 may receive the data DQ from the data buffer 115 in the first operation mode, and may store the data DQ in the memory core 140. Moreover, the data input/output block 250 may output the data, which are stored in the memory core 140, to the data buffer 115. In the second operation mode of the semiconductor apparatus 1, the data buffer 115 may not receive the data DQ from the external device, and the data input/output block 250 may not receive the data DQ from the data buffer 115. The data input/output block 250 may receive the self test address signals BSADD<0:n> from the self test address generation block 210 in the second operation mode. The data input/output block 250 may use at least one of the self test address signals BSADD<0:n> as the data DQ, and may store at least one of the self test address signals BSADD<0:n> in the memory core 140 as the data DQ.

Figure 3:
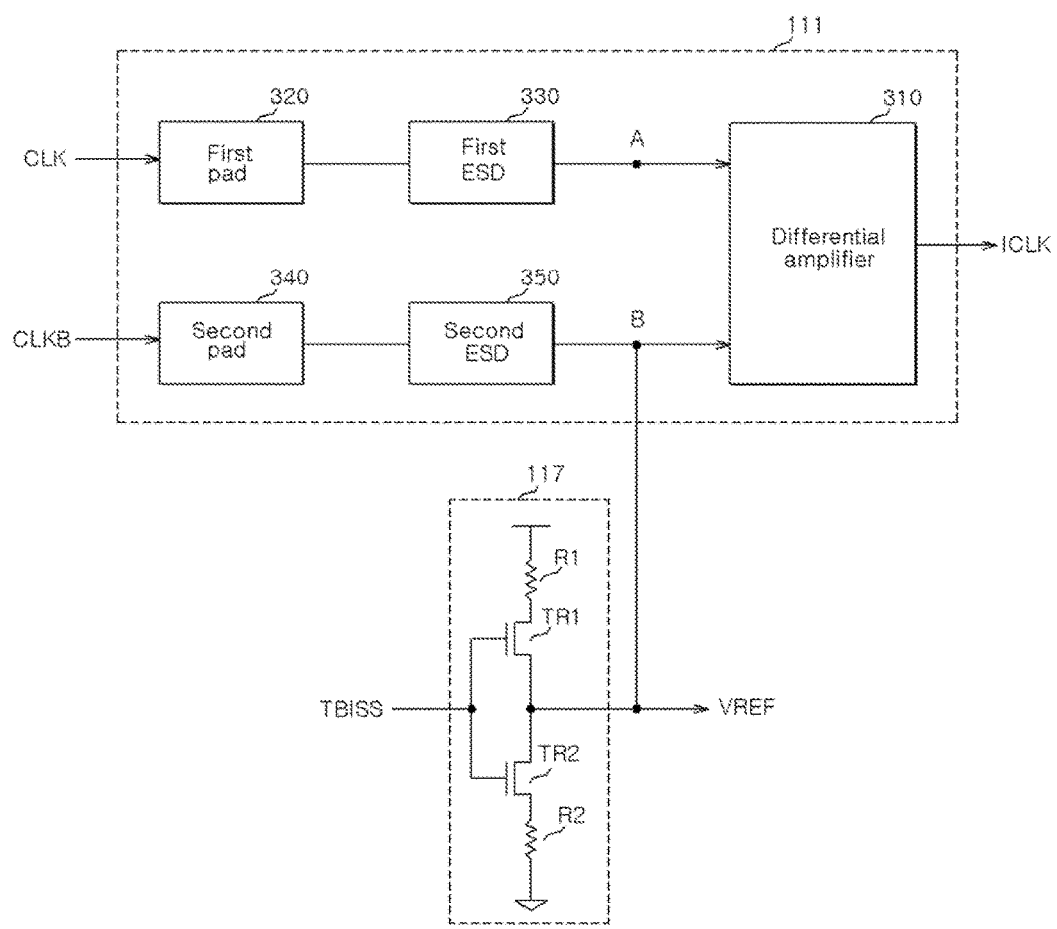
FIG. 3 is a diagram illustrating the configurations of the clock buffer and the reference voltage generation unit shown in FIG. 2.

FIG. 3 is a diagram illustrating the configurations of the clock buffer 111 and the reference voltage generation unit 117 shown in FIG. 2. In FIG. 3, the clock buffer 111 may include a differential amplifier 310. The differential amplifier 310 may differentially amplify the signals inputted through a first node A and a second node B, and may generate the internal clock signal ICLK. The clock buffer 111 may further include a first pad 320, a first ESD circuit 330, a second pad 340, and a second ESD circuit 350. The first pad 320 may receive the first clock signal CLK from the external device, and the first ESD circuit 330 may function as an electrostatic discharge protection circuit. The output of the first ESD circuit 330 may be electrically coupled with the first node A. The second pad 340 may receive the second clock signal CLKB from the external device, and the second ESD circuit 350 may function as an electrostatic discharge protection circuit. The output of the second ESD circuit 350 may be electrically coupled with the second node B.

The reference voltage generation unit 117 may include a first resistor element R1, a first transistor TR1, a second transistor TR2, and a second resistor element R2. The first resistor element R1 has one end which is electrically coupled with a power supply voltage terminal. The first transistor TR1 may have a gate which receives the normal test control signal TBISS, a drain which is electrically coupled with the other end of the first resistor element R1, and a source which is electrically coupled with the second node B. The second transistor TR2 may have a gate which receives the normal test control signal TBISS, a drain which is electrically coupled with the second node B, and a source which is electrically coupled with one end of the second resistor element R2. The other end of the second resistor element R2 may be electrically coupled with a ground voltage terminal. Through the configuration described above, when the normal test control signal TBISS is enabled, the reference voltage generation unit 117 may generate the reference voltage VREF having a predetermined voltage based on the resistance ratio of the first and second resistor elements R1 and R2, and may output the reference voltage VREF to the second node B. The predetermined voltage may be, for example, a voltage corresponding to one half of the voltage difference between a power supply voltage and a ground voltage.

When the semiconductor apparatus 1 operates in the first operation mode or performs a burn-in stress operation, both the first and second clock signals CLK and CLKB may be inputted through the first and second pads 320 and 340, and the reference voltage VREF may not be generated since the normal test control signal TBISS is disabled. Accordingly, the differential amplifier 310 may differentially amplify the first and second clock signals CLK and CLKB, and may generate the internal clock signal ICLK. When the semiconductor apparatus 1 performs the normal operation test, the normal test control signal TBISS is enabled, and the reference voltage generation unit 117 may generate the reference voltage VREF. At this time, the clock buffer 111 may receive only the first clock signal CLK through the first pad 320. Accordingly, the differential amplifier 310 may differentially amplify the first clock signal CLK received through the first node A and the reference voltage VREF received through the second node B, and may generate the internal clock signal ICLK.

In this way, during the normal operation test, the clock buffer 111 may receive the reference voltage VREF through the reference voltage generation unit 117, and the reference voltage generation unit 117 may be exclusively used for the clock buffer 111. Reference voltages may be received from the external device, and also may be generated from an internal circuit which is included in the normal operation circuit 130 or the memory core 140 shown in FIG. 1. The clock buffer 111 may generate the internal clock signal ICLK by utilizing the reference voltages. However, when the clock buffer 111 receives the reference voltages, additional switch elements are needed, and thereby, the characteristics of the clock buffer 111 may be degraded. Therefore, in the embodiment, the separate reference voltage generation unit 117 is disposed and the reference voltage VREF to be exclusively used for the clock buffer 111 is provided through the reference voltage generation unit 117 in the normal operation test of the semiconductor apparatus 1. The clock buffer 111 may retain its characteristics.

Figure 4:
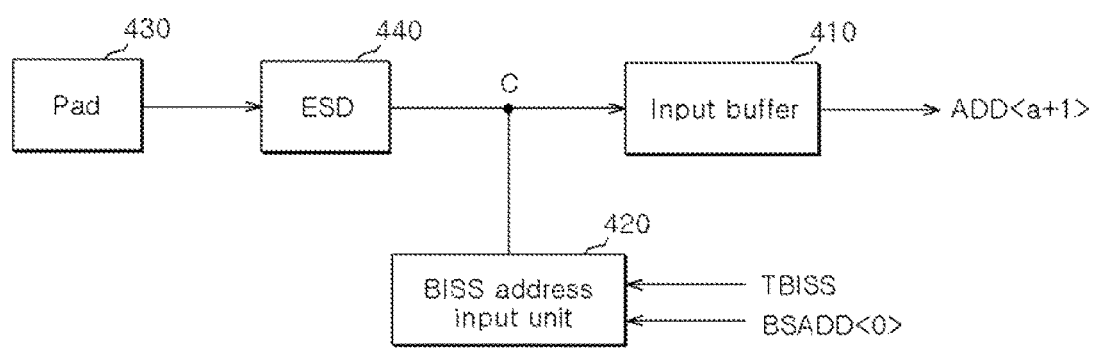
FIG. 4 is a diagram illustrating the configuration of one of the address buffers which configure the second address buffer group shown in FIG. 2.

FIG. 4 is a diagram illustrating the configuration of one of the address buffers which configure the second address buffer group 113 shown in FIG. 2. In FIG. 4, the configuration of an address buffer 113A which is configured to receive the address signal ADD<a+1> is illustrated representatively. In FIG. 4, the address buffer 113A may include an input buffer 410, and a self test address input unit (a BISS address input unit) 420. The input buffer 410 may receive an address signal from the external device or may receive an address signal from the self test address input unit 420, through a third node C. The input buffer 410 may buffer the address signal received through the third node C, and may output the buffered address signal to the internal circuit of the semiconductor apparatus 1 as the address signal ADD<a+1>.

The self test address input unit 420 may receive the normal test control signal TBISS and the self test address signal BSADD<0>. The self test address input unit 420 may output the self test address signal BSADD<0> to the third node C when the normal test control signal TBISS is enabled, and may not output the self test address signal BSADD<0> to the third node C when the normal test control signal TBISS is disabled. Accordingly, the address buffer 113A may output the address signal inputted from the external device, as the address signal ADD<a+1>, in the first operation mode of the semiconductor apparatus 1, and may output the self test address signal BSADD<0> as the address signal ADD<a+1>, in the second operation mode of the semiconductor apparatus 1. In FIG. 4, the address buffer 113A may further include a pad 430, and an ESD circuit 440. The pad 430 may receive the address signal inputted from the external device. The ESD circuit 440 may function as an electrostatic discharge protection circuit.

Figure 5:
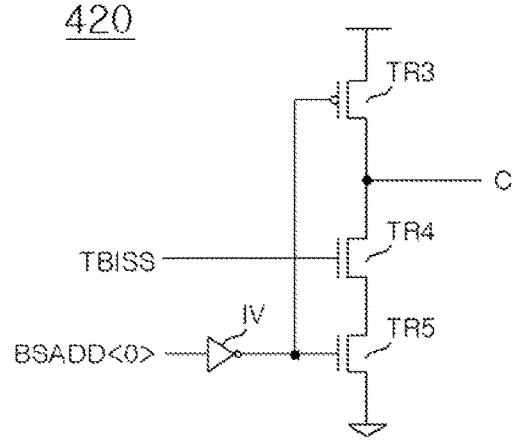
FIG. 5 is a diagram illustrating the configuration of the self test address input unit shown in FIG. 4.

FIG. 5 is a diagram illustrating the configuration of the self test address input unit 420 shown in FIG. 4. In FIG. 5, the self test address input unit 420 may include an inverter IV, and third to fifth transistors TR3 to TR5. The inverter IV may invert the self test address signal BSADD<0> and may output the inverted signal of the self test address signal BSADD<0>. The third transistor TR3 may have a gate which receives the output of the inverter IV, a source which is electrically coupled with the power supply voltage terminal, and a drain which is electrically coupled with the third node C. The fourth transistor TR4 may have a gate which receives the normal test control signal TBISS, and a drain which is electrically coupled with the third node C. The fifth transistor TR5 may have a gate which receives the output of the inverter IV, a drain which is electrically coupled with the source of the fourth transistor TR4, and a source which is electrically coupled with the ground voltage terminal. If the normal test control signal TBISS is enabled, the fourth transistor TR4 is turned on. When the self test address signal BSADD<0> has a high level, the third transistor TR3 may be turned on and a signal of a high level may be outputted to the third node C. When the self test address signal BSADD<0> has a low level, the fifth transistor TR5 may be turned on and a signal of a low level may be outputted to the third node C. When the normal test control signal TBISS is disabled or the self test address signal BSADD<0> is not inputted, the self test address input unit 420 may provide no output to the third node C.

Figure 6:
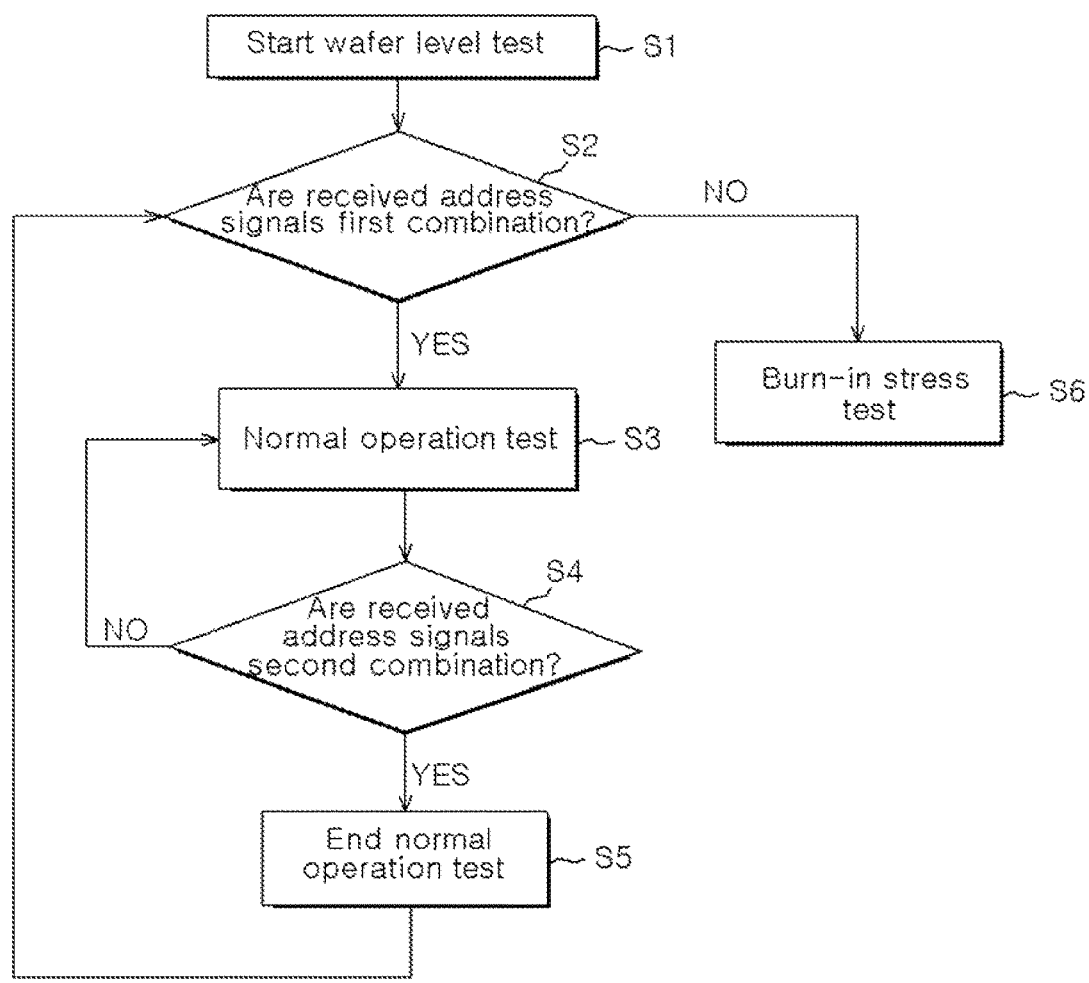
FIG. 6 is a flow chart to explain the operations of the semiconductor apparatus in accordance with the embodiment.

FIG. 6 is a flow chart to explain the operations of the semiconductor apparatus 1 in accordance with the embodiment. The operations of the semiconductor apparatus 1 in accordance with the embodiment will be described below with reference to FIGS. 1 to 6. If the wafer test signal WBI, which is enabled, is inputted through the WBI pad 116, the semiconductor apparatus 1 may enter the second operation mode and may perform a wafer level test (S1). The wafer test control unit 221 may receive the address signals ADD<0:a> from the first address buffer group 112, in response to the wafer test signal WBI which is received from the WBI pad 116. When the wafer test signal WBI is enabled, the wafer test control unit 221 may successively receive the address signals ADD<0:a> from the first address buffer group 112, and may decode the received address signals ADD<0:a> and generate the burn-in address signals WADD<0:l>. The wafer test control unit 221 may generate the burn-in address signals WADD<0:l> in such a manner that the normal test control signal TBISS may be generated by the burn-in test signal generation unit 222 when the address signals ADD<0:a> have the first logic combination. When the address signals ADD<0:a> have the first logic combination, the burn-in test signal generation unit 222 allows the normal operation test to be performed, in response to the burn-in address signals WADD<0:l> (S2 and S3). Namely, the burn-in test signal generation unit 222 may generate the normal test control signal TBISS in response to the burn-in address signals WADD<0:l>. The enabled normal test control signal TBISS (or the test command signal TCMD) may be inputted to the reference voltage generation unit 117, the command decoding block 230, the self test address generation block 210, the column counter 242 and the row counter 244, and the normal operation test may be performed while performing the normal operation of the semiconductor apparatus 1. The command decoding block 230 may generate the internal command signal ICMD based on the address signals ADD<0:a> received through the first address buffer group 112. The self test address generation block 210 may decode the address signals ADD<0:a> and may generate the self test address signals BSADD<0:n>. The self test address signals BSADD<0:n> may be inputted to the second address buffer group 113, and the second address buffer group 113 may output the self test address signals BSADD<0:n> to the column address latch unit 241 or the row address latch unit 243 as the address signals ADD<a+1:b>. Accordingly, even in the second operation mode of the semiconductor apparatus 1, the column address latch unit 241 or the row address latch unit 243 may receive address signals from the first and second address buffer groups 112 and 113, similar to the first operation mode of the semiconductor apparatus 1. Furthermore, the self test address signals BSADD<0:n> may be inputted to the column counter 242 or the row counter 244, and may be used to increase or decrease the logic value of the address signals which are latched by the column address latch unit 241 or the row address latch unit 243, to change the logic levels of the internal address signals CADD<0:k> or RADD<0:k>. At least one of the self test address signals BSADD<0:n> may be used as the data DQ, and the self test address signal to be used as the data DQ may be stored in the emery core 140 through the data input/output block 250.

Thereafter, when the address signals ADD<0:a> received through the first address buffer group 112 have a second logic combination (S4), the burn-in test signal generation unit 222 may disable the normal test control signal TBISS such that the normal operation test of the semiconductor apparatus 1 may end (S5). When the address signals ADD<0:a> do not have the second logic combination, a different kind of normal operation test may be performed. When the normal operation test is ended and the address signals ADD<0:a> have a logic combination other than the first logic combination, the burn-in stress test, which is generally known in the art may be performed (S6).

Operation modes based on the logic combinations of the address signals ADD<0 a> received through the first address buffer group 112 may be defined as in the following Table 1, for example. Representatively, the logic combinations of partial address signals ADD<0:3> are defined as an example.

TABLE 1

| Operation mode | A<0> | A<1> | A<2> | A<3> |
| --- | --- | --- | --- | --- |
| BISS entry | L | H | L | L |
| NT1 | H | H | L | L |
| NT2 | L | L | H | L |
| : | : | : | : | : |
| WBI reset | H | H | H | H |

When the address signals ADD<0:3> are inputted as L, H, L and L, the burn-in test signal generation unit 222 may enable the normal test control signal TBISS, and the semiconductor apparatus 1 may enter a mode for performing a normal operation test (BISS entry). Thereafter, as the addresses ADD<0:3> are inputted with various logic combinations, the semiconductor apparatus 1 may perform various normal operation tests (NT1 and NT2). While the two normal operation tests NT1 and NT2 and the logic combinations of the address signals ADD<0:3> therefor are given as an example in Table 1, it is to be noted that the embodiment is not limited to such. Normal operations may include not only a write operation and a read operation but also various other operations, for example, but not limited to, an operation for enabling and accessing all row lines of the memory core 140, an operation for accessing an even-numbered or odd-numbered mat (which may be the unit area of a memory array), an operation for activating an electrical fuse array, an operation for activating a sense amplifier and an auto refresh operation. When the address signals ADD<0:3> are inputted as H, H, H and H, the burn-in test signal generation unit 222 may disable the normal test control signal TBISS. The logic combination of H, H, H and H may be used to initialize (or reset) the wafer level test which is currently being performed (WBI reset).

When the address signals ADD<0:a> do not have the specified logic combination, the burn-in test signal generation unit 222 may generate the burn-in test control signals BIS<0:m> for performing the burn-in stress test that is generally known in the art. Therefore, based on the burn-in test control signals BIS<0:m>, the burn-in stress test of the semiconductor apparatus 1 may be performed.

As is apparent from the above descriptions, according to the embodiment, since a normal operation test is performed at a wafer level, the precision of tests may be increased and the reliability of products may be improved. Also, since bad semiconductor apparatuses may be sorted before packaging, the manufacturing cost of semiconductor apparatuses may be reduced.

While various embodiments have been described above, it will be understood to those skilled in the art that the embodiments described are examples only. Accordingly, the inventive concept described herein should not be limited based on the described embodiments.

What is claimed is:

1. A semiconductor apparatus comprising:
a clock buffer suitable for generating an internal clock signal, based on first and second clock signals, in a first operation mode, and generating the internal clock signal, based on the first clock signal and a reference voltage, when a normal operation test is performed in a second operation mode; and
a reference voltage generation unit suitable for generating the reference voltage when the normal operation test is performed in the second operation mode.

2. The semiconductor apparatus according to claim 1, further comprising:
a first address buffer group suitable for receiving first address signals from an external device in the first and second operation modes; and
a second address buffer group suitable for receiving second address signals from the external device, in the first operation mode, and receiving third address signals which are generated in an internal circuit, in the second operation mode.

3. The semiconductor apparatus according to claim 2, further comprising:
a self test address generation block suitable for generating a plurality of self test address signals as the third address signals, based on the first address signals received through the first address buffer group, in the second operation mode.

4. The semiconductor apparatus according to claim 3, further comprising:
an address latch unit suitable for latching address signals which are received from the first and second address buffer groups, and generating internal address signals, in the first and second operation modes.

5. The semiconductor apparatus according to claim 2, wherein the semiconductor apparatus performs one of a burn-in stress test and the normal operation test, based on the first address signals received through the first address buffer group in the second operation mode.

6. The semiconductor apparatus according to claim 5, wherein the semiconductor apparatus generates a plurality of burn-in test control signals, based on the first address signals received through the first address buffer group, when performing the burn-in stress test.

7. The semiconductor apparatus according to claim 3, wherein the semiconductor apparatus accesses a memory core, based on the first address signals received through the first address buffer group and the third address signals received through the second address buffer group, when performing the normal operation test.

8. The semiconductor apparatus according to claim 3, wherein one or more of the plurality of self test address signals is used as data.

9. The semiconductor apparatus according to claim 3, further comprising:
a core access block suitable for latching address signals received from the first and second address buffer groups and changing a logic value of latched address signals, based on the self test address signals, in the second operation mode.

10. The semiconductor apparatus according to claim 3, wherein the second address buffer group comprises a plurality of address buffers, and
wherein each of the plurality of address buffers comprises:
a node suitable for receiving an address signal from the external device;
a self test address input unit suitable for outputting a self test address signal to the node in the second operation mode; and
an input buffer suitable for buffering a signal inputted through the node, and providing a buffered signal to the address latch unit.

11. A semiconductor apparatus comprising:
a test control block suitable for generating burn-in test control signals for a burn-in stress test and a normal test control signal for a normal operation test, based on first address signals received through a first address buffer group, when a wafer test signal is enabled; and
a clock buffer suitable for generating an internal clock signal, based on first and second clock signals, in a normal operation mode, and generating the internal clock signal, based on the first clock signal and a reference voltage, during the normal operation test.

12. The semiconductor apparatus according to claim 11, further comprising:
a reference voltage generation unit suitable for generating the reference voltage in response to the normal test control signal.

13. The semiconductor apparatus according to claim 11, wherein the first address buffer group provides the first address signals received from an external device to an internal circuit in a first operation mode and a second operation mode.

14. The semiconductor apparatus according to claim 13, further comprising:
a self test address generation block suitable for decoding the first address signals received through the first address buffer group and generating a plurality of self test address signals, in response to the normal test control signal.

15. The semiconductor apparatus according to claim 14, further comprising:
a second address buffer group suitable for providing second address signals received from the external device to the internal circuit in the first operation mode, and providing the plurality of self test address signals to the internal circuit, in the second operation mode.

16. The semiconductor apparatus according to claim 15, wherein the second address buffer group comprises a plurality of address buffers, and
wherein each of the plurality of address buffers comprises:
a node suitable for receiving an address signal from the external device;
a self test address input unit suitable for outputting a self test address signal to the node when the normal test control signal is enabled; and
an input buffer suitable for buffering a signal inputted through the node, and providing a buffered signal to an internal circuit.

17. The semiconductor apparatus according to claim 12, wherein the reference voltage generation unit includes first and second resistor elements and generates the reference voltage having a predetermined voltage based on a resistance ratio of the first and second resistor elements, when the normal test control signal is enabled.

18. The semiconductor apparatus according to claim 17, wherein the clock buffer differentially amplifies the first clock signal and one of the second clock signal and the reference voltage to generate the internal clock signal.

* * * * *